(12) United States Patent
Liu et al.

(10) Patent No.: US 11,079,670 B2
(45) Date of Patent: Aug. 3, 2021

(54) MANUFACTURING METHOD OF PHASE SHIFT MASK AND PHASE SHIFT MASK

(71) Applicants: Beijing BOE Display Technology Co., Ltd., Beijing (CN); BOE Technology Group Co., Ltd., Beijing (CN)

(72) Inventors: Mingxuan Liu, Beijing (CN); Huibin Guo, Beijing (CN); Yongzhi Song, Beijing (CN); Xiaoxiang Zhang, Beijing (CN); Wenqing Xu, Beijing (CN); Zumou Wu, Beijing (CN); Xiaolong Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 16/334,870

(22) PCT Filed: Sep. 21, 2018

(86) PCT No.: PCT/CN2018/107043
§ 371 (c)(1),
(2) Date: Mar. 20, 2019

(87) PCT Pub. No.: WO2019/153754
PCT Pub. Date: Aug. 15, 2019

(65) Prior Publication Data
US 2020/0174359 A1 Jun. 4, 2020

(30) Foreign Application Priority Data
Feb. 11, 2018 (CN) .......................... 201810143213.8

(51) Int. Cl.
*G03F 1/26* (2012.01)

(52) U.S. Cl.
CPC ...................................... *G03F 1/26* (2013.01)

(58) Field of Classification Search
CPC .......................................................... G03F 1/26
See application file for complete search history.

(56) References Cited

U.S. PATENT DOCUMENTS

| 5,556,725 A | * | 9/1996 | Ham | G03F 7/2022 |
|---|---|---|---|---|
| | | | | 430/5 |
| 5,728,491 A | * | 3/1998 | Keum | G03F 1/30 |
| | | | | 430/5 |

(Continued)

FOREIGN PATENT DOCUMENTS

| CN | 1042873 C | 4/1999 |
|---|---|---|
| CN | 108345171 A | 7/2018 |
| JP | H04-166839 A | 6/1992 |

OTHER PUBLICATIONS

International Search Report and Written Opinion (including English translations of search report and Box V of Written Opinion) for International Application No. PCT/CN2018/107043, dated Dec. 27, 2018, 17 pages.

*Primary Examiner* — Stewart A Fraser
(74) *Attorney, Agent, or Firm* — Westman, Champlin & Koehler, P.A.

(57) ABSTRACT

Disclosed are a manufacturing method of a phase shift mask and a phase shift mask. The manufacturing method of a phase shift mask includes: forming a pattern of metal shielding layer on a base substrate; forming a phase shift layer and a first photoresist layer in sequence on the pattern of metal shielding layer; patterning the first photoresist layer with the pattern of metal shielding layer serving as a mask to form a pattern of first photoresist layer; and etching the phase shift layer with the pattern of first photoresist layer serving as a mask to form a pattern of phase shift layer.

6 Claims, 8 Drawing Sheets

(56) References Cited

U.S. PATENT DOCUMENTS

| | | | | |
|---|---|---|---|---|
| 5,738,959 A * | 4/1998 | Miyashita | ............... | G03F 1/32 430/5 |
| 2002/0004181 A1 * | 1/2002 | Okamoto | ............... | G03F 1/29 430/311 |

* cited by examiner

MANUFACTURING METHOD OF PHASE SHIFT MASK AND PHASE SHIFT MASK

CROSS-REFERENCE TO RELATED APPLICATION

This application is a Section 371 National Stage Application of International Application No. PCT/CN2018/107043, filed on Sep. 21, 2018, entitled "MANUFACTURING METHOD OF PHASE SHIFT MASK AND PHASE SHIFT MASK", which claims the benefit of Chinese Patent Application No. 201810143213.8 filed on Feb. 11, 2018 in the State Intellectual Property Office of China, the whole disclosure of which is incorporated herein by reference.

TECHNICAL FIELD

The present disclosure relates to the field of display technology, and in particular, to a manufacturing method of a phase shift mask and a phase shift mask.

BACKGROUND

With the development of display technology, design specifications of display products are gradually increasing. For example, a display screen is required to have ultra-high resolution and an ultra-narrow bezel, so that it requires more and more complicated and elaborate manufacturing process. At present, an exposure machine is widely used in manufacturing process of a display panel, but a line width of a product produced by the exposure machine has not met demands. In order to cope with such a problem, one of solutions in the related art is to use a phase shift mask (abbreviated as PSM).

SUMMARY

In one aspect, it is provided a manufacturing method of a phase shift mask including: forming a pattern of metal shielding layer on a base substrate; forming a phase shift layer and a first photoresist layer in sequence on the pattern of metal shielding layer; patterning the first photoresist layer with the pattern of metal shielding layer serving as a mask to form a pattern of first photoresist layer; and etching the phase shift layer with the pattern of first photoresist layer serving as a mask to form a pattern of phase shift layer.

Optionally, patterning the first photoresist layer with the pattern of metal shielding layer serving as the mask to form the pattern of first photoresist layer includes: enabling at least a portion of light emitted from an exposure machine located at a side of the base substrate facing away from the pattern of metal shielding layer to be transmitted through the phase shift layer having a light transmitting property, with shielding by the pattern of metal shielding layer, such that the first photoresist layer is exposed to form the pattern of first photoresist layer.

Optionally, exposing the first photoresist layer includes: under-exposing the first photoresist layer such that an orthographic projection of the pattern of first photoresist layer on the base substrate completely covers an orthographic projection of the pattern of metal shielding layer on the base substrate and an area of the orthographic projection of the pattern of first photoresist layer on the base substrate is larger than an area of the orthographic projection of the pattern of metal shielding layer on the base substrate.

Optionally, etching the phase shift layer with the pattern of first photoresist layer serving as the mask to form the pattern of phase shift layer includes: etching the phase shift layer with the pattern of first photoresist layer serving as the mask to form the pattern of phase shift layer in such a way that an orthographic projection of the pattern of phase shift layer on the base substrate completely covers the orthographic projection of the pattern of metal shielding layer on the base substrate and an area of the orthographic projection of the pattern of phase shift layer on the base substrate is larger than the area of the orthographic projection of the pattern of metal shielding layer on the base substrate.

Optionally, forming the pattern of metal shielding layer on the base substrate includes: forming a metal shielding layer and a second photoresist layer in sequence on the base substrate; patterning the second photoresist layer to form a pattern of second photoresist layer; etching the metal shielding layer with the pattern of second photoresist layer serving as a mask to form the pattern of metal shielding layer; and removing the pattern of second photoresist layer.

Optionally, patterning the second photoresist layer to form the pattern of second photoresist layer includes: drawing and patterning the second photoresist layer by using a drawing machine to form the pattern of second photoresist layer.

Optionally, the manufacturing method may further include: after forming the pattern of phase shift layer, removing the pattern of first photoresist layer.

In another aspect, it is provided a phase shift mask, wherein the phase shift mask is manufactured by the manufacturing method as stated above.

In a further aspect, it is provided a phase shift mask including a base substrate; a pattern of metal shielding layer on the base substrate; and a pattern of phase shift layer covering the pattern of metal shielding layer, wherein an orthographic projection of the pattern of phase shift layer on the base substrate completely covers the orthographic projection of the pattern of metal shielding layer on the base substrate and an area of the orthographic projection of the pattern of phase shift layer on the base substrate is larger than an area of the orthographic projection of the pattern of metal shielding layer on the base substrate, and widths of the orthographic projection of the pattern of phase shift layer on the base substrate extending beyond the pattern of metal shielding layer on both opposite sides of the pattern of metal shielding layer are identical to each other.

Optionally, the widths of the orthographic projection of the pattern of phase shift layer on the base substrate extending beyond the pattern of metal shielding layer on both opposite sides of the pattern of metal shielding layer are in a range from 0.3 μm to 1μm, respectively.

Optionally, a material of the pattern of metal shielding layer includes chromium.

Optionally, a material of the pattern of phase shift layer includes chromium oxide or molybdenum oxide.

DETAILED DESCRIPTION OF EMBODIMENTS

In order to make objectives, technical solutions and advantages of the present disclosure more clear, the present disclosure will be further described in detail with reference to accompanying drawings. It is apparent that embodiments described below are only a part of embodiments of the present disclosure, rather than all embodiments of the present disclosure. All other embodiments which may be obtained by those skilled in the art based on the embodiments of the present disclosure without any creative work shall be included in the scope of the disclosure.

Shapes and sizes of various components in the accompanying drawings do not reflect true proportions, and are merely intended to illustrate the present disclosure.

As used herein, an expression "drawing machine" refers to a direct writing exposure machine or a direct writing lithography machine, such as a laser direct writing exposure machine or a laser direct writing lithography machine, which may also be expressed as a laser writer or a mask writing machine.

The inventors have found through research that: a pattern of phase shift layer is additionally formed on a pattern of metal shielding layer in a phase shift mask, compared with a conventional mask. Light is transmitted through the pattern of phase shift layer and a phase of the light is shifted by 180° by the pattern of phase shift layer, so that a phase cancellation is presented between the light and adjacent light so as to increase an exposure resolution. In a current phase shift mask manufacturing process, two aligned exposures are required, so that there may be an alignment offset between the two aligned exposures. As a result, it is possible to misalign the pattern of phase shift layer and the pattern of metal shielding layer, which may adversely affect a use effect of the phase shift mask.

Figure 1:
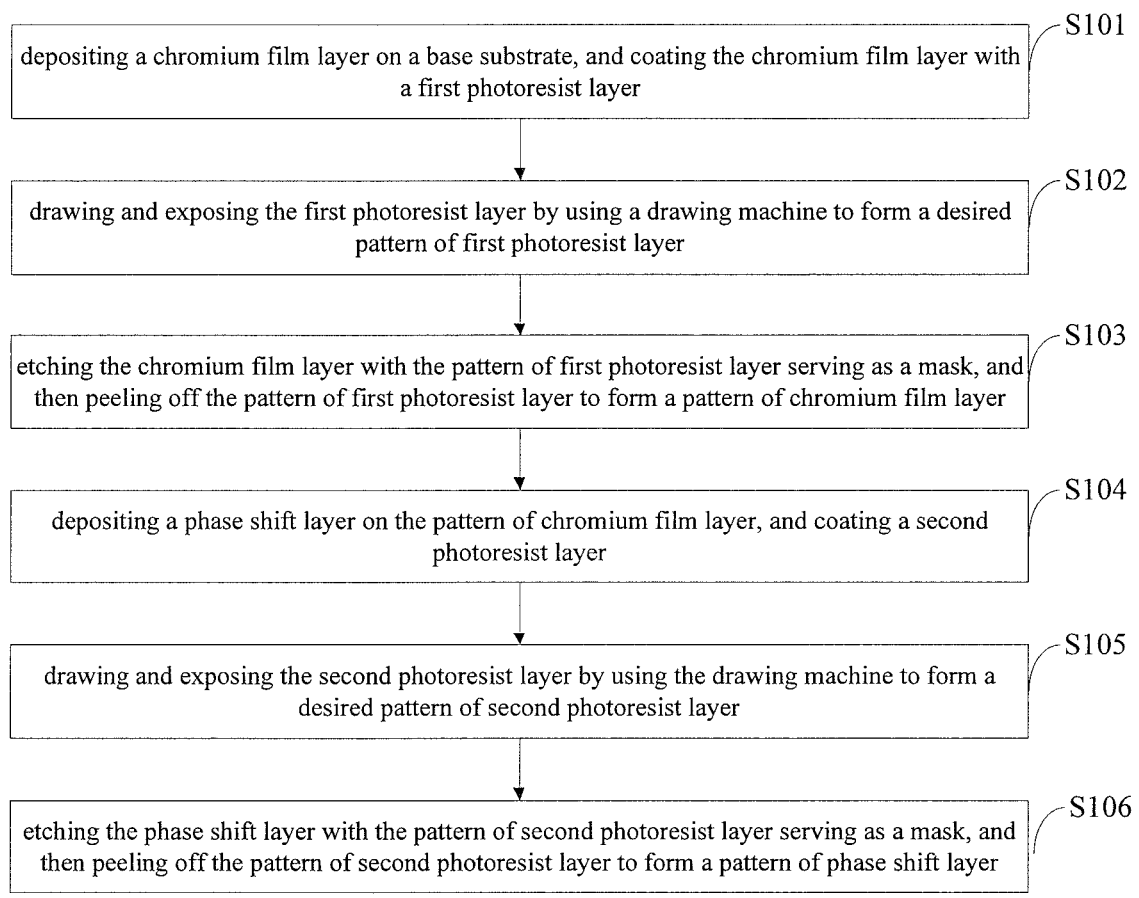
FIG. 1 is a schematic flow chart of a manufacturing method of a phase shift mask in the related art.
Figure 2A:
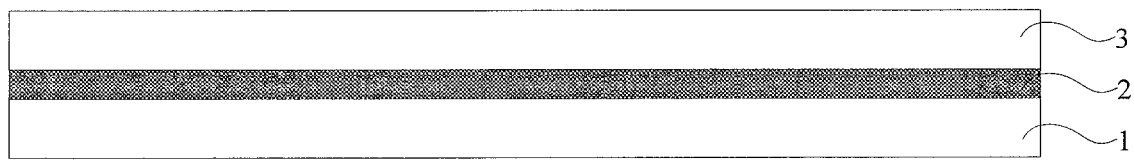
FIG. 2a to FIG. 2f are schematic views of structures formed after various steps of the manufacturing method of the phase shift mask in the related art, respectively.
Figure 2B:
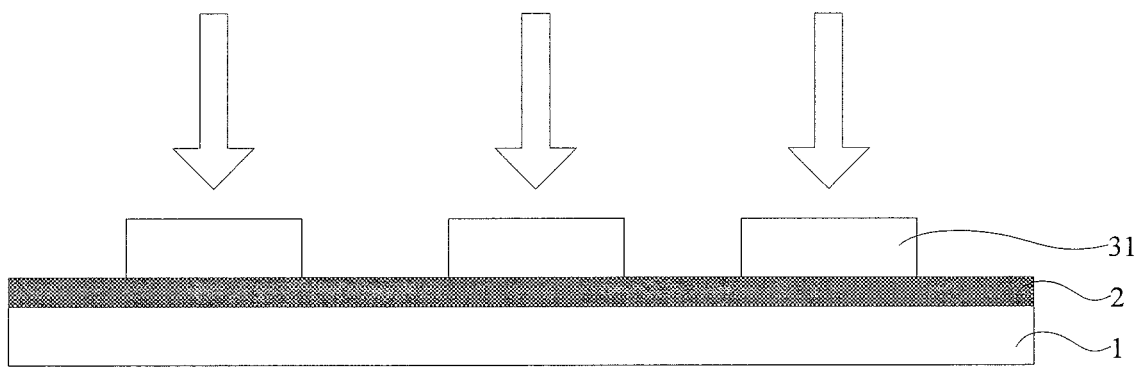
Figure 2C:
Figure 2D:
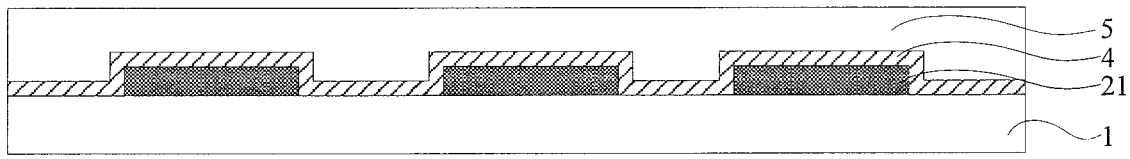
Figure 2E:
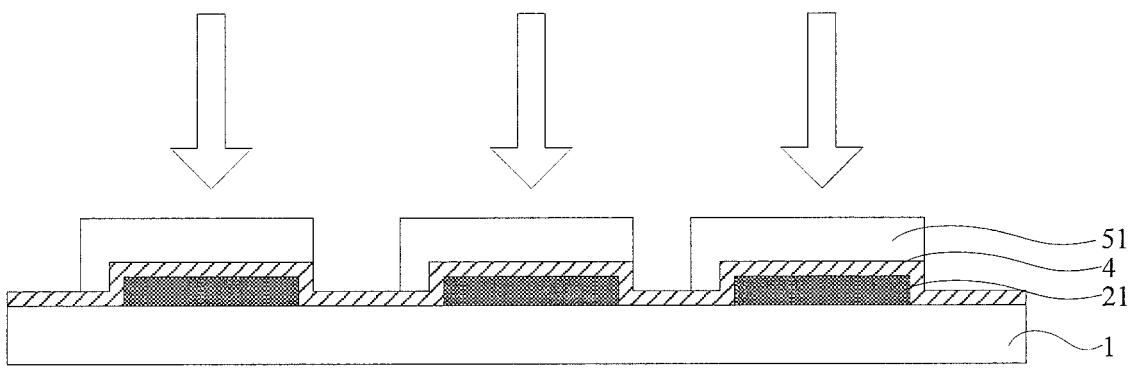
Figure 2F:
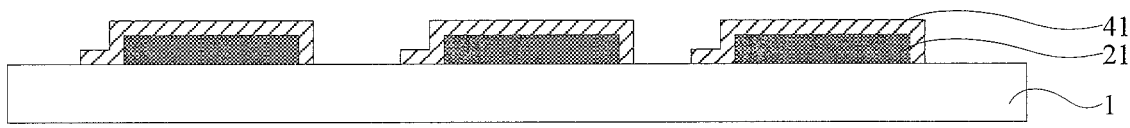

As shown in FIG. 1, a manufacturing method of a phase shift mask in the related art may include the following steps:

S101, depositing a chromium (Cr) film layer 2 on a base substrate 1, and coating the chromium film layer 2 with a first photoresist layer 3, as shown in FIG. 2a;

S102, drawing and exposing the first photoresist layer 3 by using a drawing machine to form a desired pattern 31 of first photoresist layer, as shown in FIG. 2b; wherein the drawing machine may be specifically operated in a principle that the desired pattern of first photoresist layer is input into the drawing machine, and the drawing machine outputs specific light (e.g., laser) to illuminate the first photoresist layer 3 according to the pattern so as to perform a spot exposure;

S103, etching the chromium film layer 2 with the pattern 31 of first photoresist layer serving as a mask, and then peeling off the pattern 31 of first photoresist layer to form a pattern 21 of chromium film layer, as shown in FIG. 2c;

S104, depositing a phase shift layer 4 on the pattern 21 of chromium film layer, and coating a second photoresist layer 5, as shown in FIG. 2d;

S105, drawing and exposing the second photoresist layer 5 by using the drawing machine to form a desired pattern 51 of second photoresist layer, as shown in FIG. 2e; and S106, etching the phase shift layer 4 with the pattern 51 of second photoresist layer serving as a mask, and then peeling off the pattern 51 of second photoresist layer to form a pattern 41 of phase shift layer, as shown in FIG. 2f.

Figure 3A:
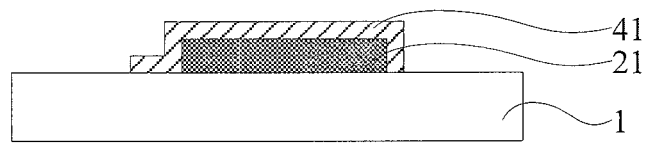
FIG. 3a is a schematic structural view of a phase shift mask manufactured by the manufacturing method in the related art.
Figure 3B:
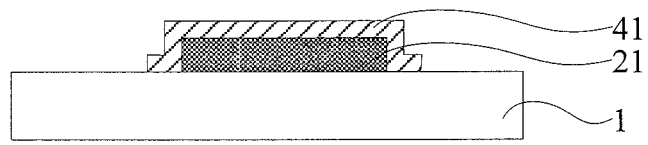
FIG. 3b is a schematic structural view of an ideal phase shift mask.

It can be seen from the above manufacturing processes that the steps S102 and S105 both adopt the drawing machine to perform drawing and patterning processes. In other words, during the manufacturing processes, two aligned exposures are required, and there may be an alignment offset between the two aligned exposures, resulting in a misalignment between the pattern 41 of phase shift layer and the pattern 21 of chromium film layer in the manufactured phase shift mask. As shown in FIG. 3a, portions of the pattern 41 of phase shift layer on two opposite sides of the pattern 21 of chromium film layer may be asymmetrical with each other. FIG. 3b shows a structure of an ideal phase shift mask. Compared with the structure of the ideal phase shift mask shown in FIG. 3b, the structure of the phase shift mask shown in FIG. 3a may affect adversely a use effect of the phase shift mask.

Figure 4:
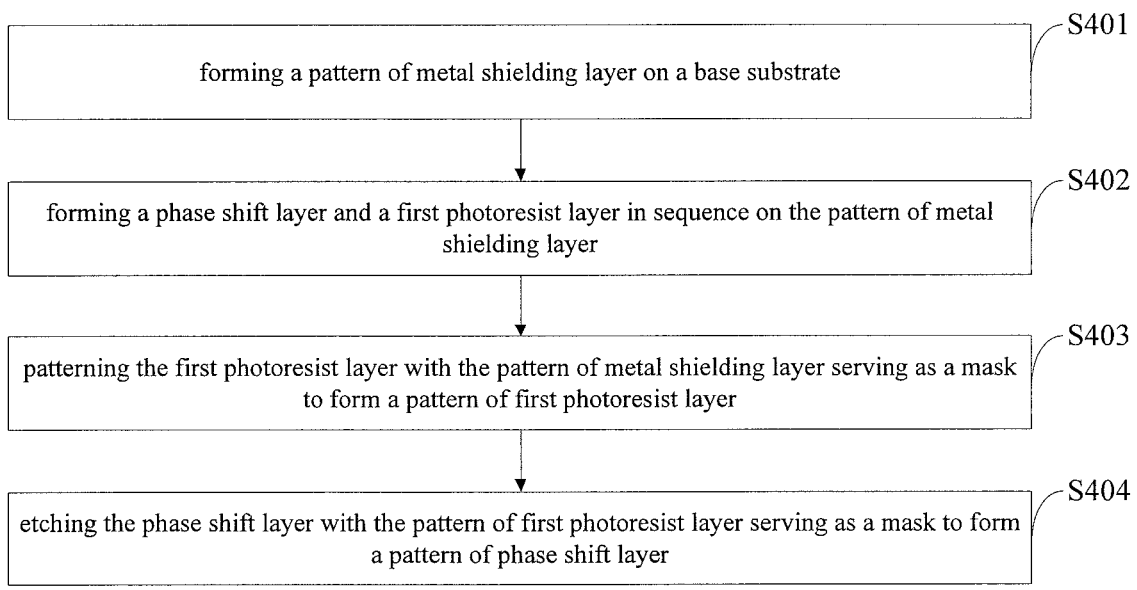
FIG. 4 is a schematic flow chart showing a part of a manufacturing method of a phase shift mask according to an embodiment of the present disclosure.

Based on this, an embodiment of the present disclosure provides a manufacturing method of a phase shift mask, as shown in FIG. 4, the method may specifically include the following steps:

S401, forming a pattern of metal shielding layer on a base substrate;

S402, forming a phase shift layer and a first photoresist layer in sequence on the pattern of metal shielding layer;

S403, patterning the first photoresist layer with the pattern of metal shielding layer serving as a mask to form a pattern of first photoresist layer; and S404: etching the phase shift layer with the pattern of first photoresist layer serving as a mask to form a pattern of phase shift layer.

Optionally, an orthographic projection of the pattern of first photoresist layer on the base substrate completely covers an orthographic projection of the pattern of metal shielding layer on the base substrate, and an area of the orthographic projection of the pattern of first photoresist layer on the base substrate is larger than an area of the orthographic projection of the pattern of metal shielding layer on the base substrate.

Optionally, an orthographic projection of the pattern of phase shift layer on the base substrate also completely covers the orthographic projection of the pattern of metal shielding layer on the base substrate, and an area of the orthographic projection of the pattern of phase shift layer on the base substrate is larger than an area of the orthographic projection of the pattern of metal shielding layer on the base substrate.

Specifically, in the above manufacturing method provided by the embodiment of the present disclosure, the first photoresist layer is patterned with the pattern of metal shielding layer serving as the mask in the step S403, instead of patterning the first photoresist layer by using the drawing machine in the related art, so that a self-alignment between the pattern of first photoresist layer and the pattern of metal shielding layer is achieved. In this way, the alignment offset which occurs in the exposures by using the drawing machine may be avoided. Thus, the pattern of phase shift layer and the pattern of metal shielding layer may be strictly aligned without any offset.

Optionally, in the above manufacturing method provided by the embodiment of the present disclosure, the step S403 of patterning the first photoresist layer with the pattern of metal shielding layer serving as the mask to form the pattern of first photoresist layer may be specifically implemented as follows.

As a result of shielding by the pattern of metal shielding layer, at least a portion of light emitted from an exposure machine located at a side of the base substrate facing away from the pattern of metal shielding layer is transmitted through the phase shift layer with a light transmitting property, such that the first photoresist layer is exposed to form the pattern of first photoresist layer.

Specifically, the phase shift layer may be in a transparent state or a translucent state, which is not limited herein. For example, a material of the phase shift layer may include chromium (Cr) oxide or molybdenum (Mo) oxide.

Specifically, the exposure machine may be adopted to perform a surface exposure onto the first photoresist layer. Thus, it may save time, reduce cost and improve production efficiency, compared with the spot exposure by using the drawing machine. For example, in a case of manufacturing a phase shift mask of 1.4 m×1.2 m, it takes only a few seconds to perform the exposure by using the exposure machine, but it may take several tens of hours to perform the exposure by using the drawing machine. Thus, the embodiment of the present disclosure may shorten a production cycle greatly.

Optionally, in the above manufacturing method provided by the embodiment of the present disclosure, the first photoresist layer may be under-exposed in order to ensure that the orthographic projection of the pattern of first photoresist layer on the base substrate completely covers the orthographic projection of the pattern of metal shielding layer on the base substrate and the area of the orthographic projection of the pattern of first photoresist layer on the base substrate is larger than the area of the orthographic projection of the pattern of metal shielding layer on the base substrate. In this way, the subsequently formed pattern of phase shift layer may have portions extending beyond the pattern of metal shielding layer. Specifically, when the first photoresist layer is exposed, portions of the first photoresist layer at edge regions of the pattern of metal shielding layer may be exposed insufficiently so that the portions of the first photoresist layer at the edge regions of the pattern of metal shielding layer may be kept. Since light diffraction phenomenon occurs during exposure, an exposure value at edge regions is smaller than an exposure value at a central region, that is, the exposure value may be adjusted so that a line width (i.e., CD value) of the exposure is smaller than a standard line width (i.e., base CD value). As a result, the first photoresist layer at the edge regions may be under-exposed so that the portions of the pattern of first photoresist layer at the edge regions are kept. The specific under-exposure process parameters such as the exposure value and an exposure time may be adjusted according to actual data, which are not limited herein. By adjusting the process parameters, it may be achieved that widths of the orthographic projection of the pattern of phase shift layer on the base substrate extending beyond the pattern of metal shielding layer on both opposite sides of the pattern of metal shielding layer are substantially in a range from 0.3 µm to 1 µm, respectively, which may achieve a good coherent light cancellation.

Figure 5:
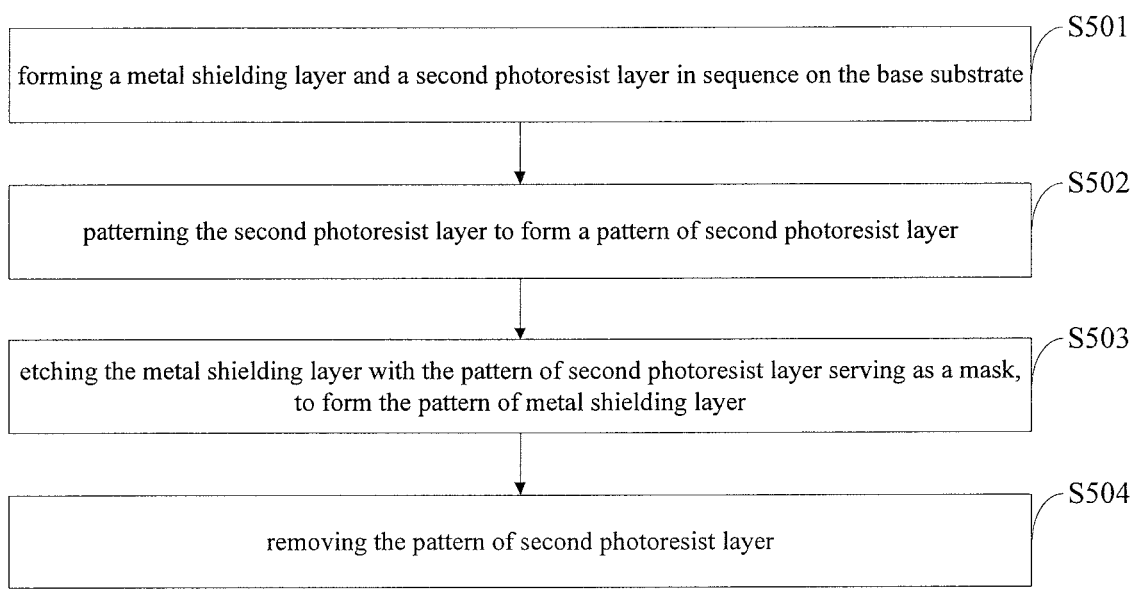
FIG. 5 is a schematic flow chart showing another part of a manufacturing method of a phase shift mask according to an embodiment of the present disclosure.

Optionally, in the above-mentioned manufacturing method provided by the embodiment of the present disclosure, the step S401 of forming the pattern of metal shielding layer on the base substrate may specifically include the following steps, as shown in FIG. 5.

In step S501, a metal shielding layer and a second photoresist layer are formed in sequence on the base substrate.

Specifically, a material of the metal shielding layer may be metal chromium (Cr), and a material of the second photoresist layer may be a positive photoresist or a negative photoresist, which is not limited herein.

In step S502, the second photoresist layer is patterned to form a pattern of second photoresist layer.

Specifically, the second photoresist layer may be patterned by using the drawing machine to form the pattern of second photoresist layer.

In step S503, the metal shielding layer is etched with the pattern of second photoresist layer serving as a mask, to form the pattern of metal shielding layer.

Specifically, the formed pattern of metal shielding layer is identical to the pattern of second photoresist layer.

In step S504, the pattern of second photoresist layer is removed.

Optionally, in the above manufacturing method provided by the embodiment of the present disclosure, the pattern of metal shielding layer is used as the mask to form the pattern of first photoresist layer, and it is required that the pattern of phase shift layer is identical to the pattern of first photoresist layer, so that the material of the first photoresist layer may use a positive photoresist.

Optionally, in the above manufacturing method provided by the embodiment of the present disclosure, after the step S404 of forming the pattern of phase shift layer, the method may further include: removing the pattern of first photoresist layer.

The specific processes of the manufacturing method provided by the embodiment of the present disclosure will be described in detail below with reference to a specific embodiment.

Figure 6:
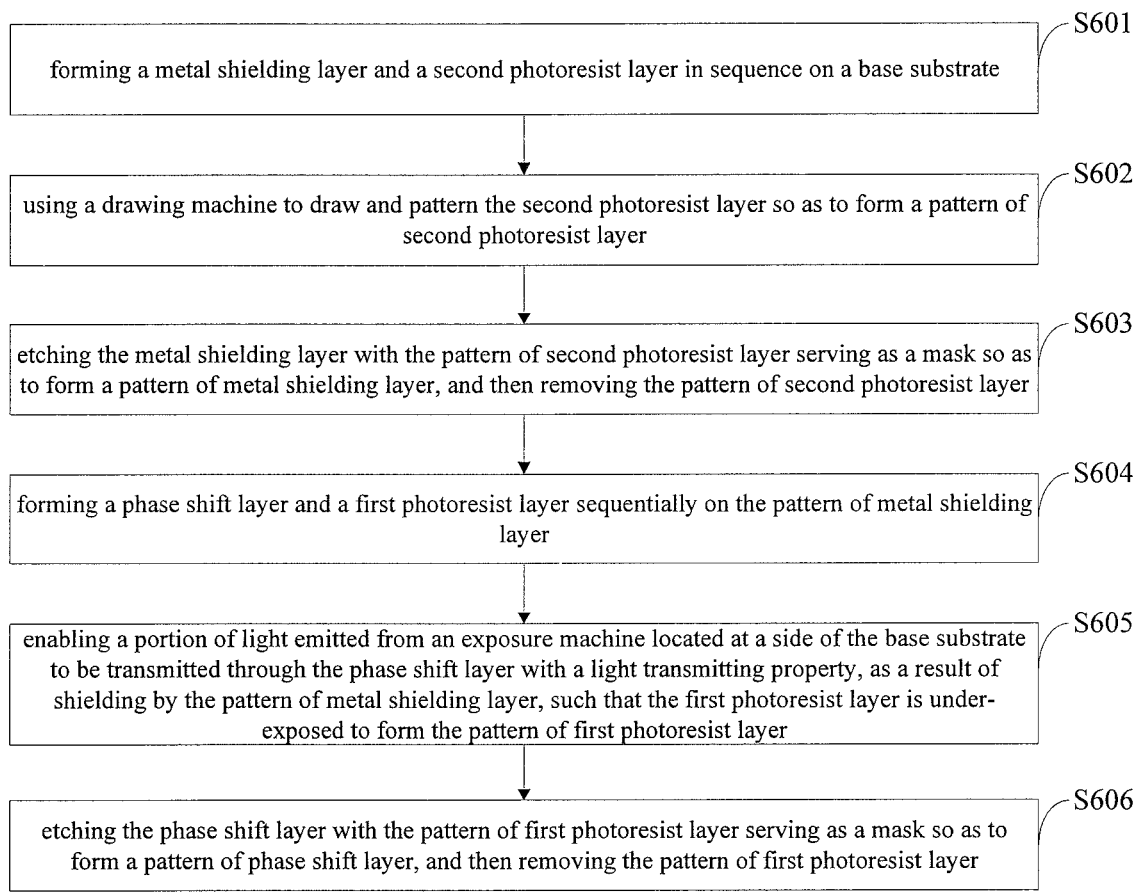
FIG. 6 is a schematic flow chart showing a complete process of a manufacturing method of a phase shift mask according to an embodiment of the present disclosure.

The complete processes of the manufacturing method provided by the embodiment of the present disclosure may be as shown in FIG. 6, and specifically include the following steps.

Figure 7A:
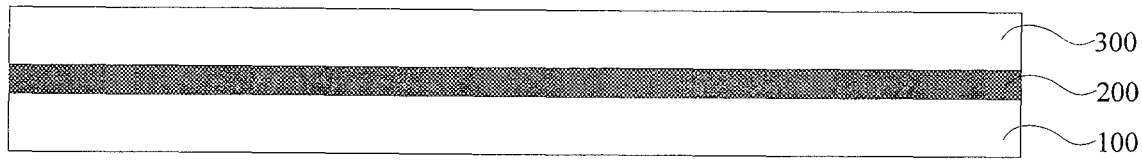
FIG. 7a to FIG. 7f are schematic views of structures formed after various steps of a manufacturing method of a phase shift mask according to an embodiment of the present disclosure, respectively.

In step S601, a metal shielding layer 200 and a second photoresist layer 300 are formed in sequence on a base substrate 100, as shown in FIG. 7a. The material of the metal shielding layer 200 may include a light-shielding material such as chromium, and the material of the second photoresist layer 300 may include a positive photoresist or a negative photoresist.

Figure 7B:
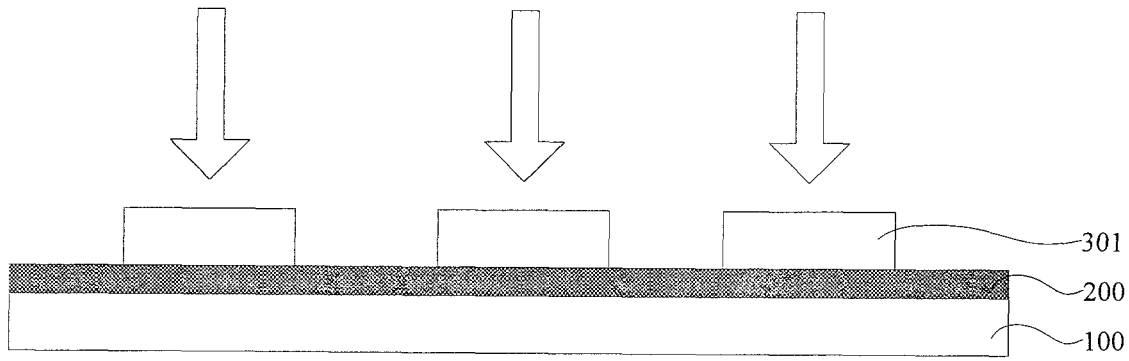

In step S602, a drawing machine is used to draw and pattern the second photoresist layer 300 so as to form a pattern 301 of second photoresist layer, as shown in FIG. 7b.

Figure 7C:

In step S603, the pattern 301 of second photoresist layer is used as a mask to etch the metal shielding layer 200 so as to form a pattern 201 of metal shielding layer, and then the pattern 301 of second photoresist layer is removed, as shown in FIG. 7c.

Figure 7D:
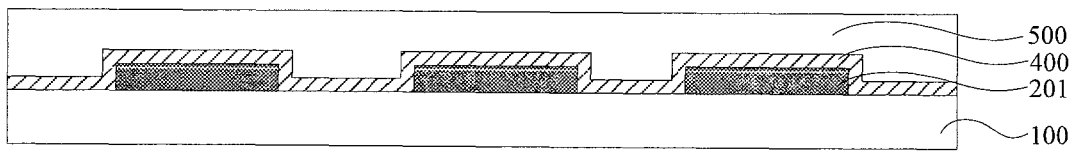

In step S604, a phase shift layer 400 and a first photoresist layer 500 are sequentially formed on the pattern 201 of metal shielding layer, as shown in FIG. 7d. The material of the phase shift layer 400 may be selected from chromium (Cr) oxide or molybdenum (Mo) oxide, and the material of the first photoresist layer 500 may include a positive photoresist.

Figure 7E:
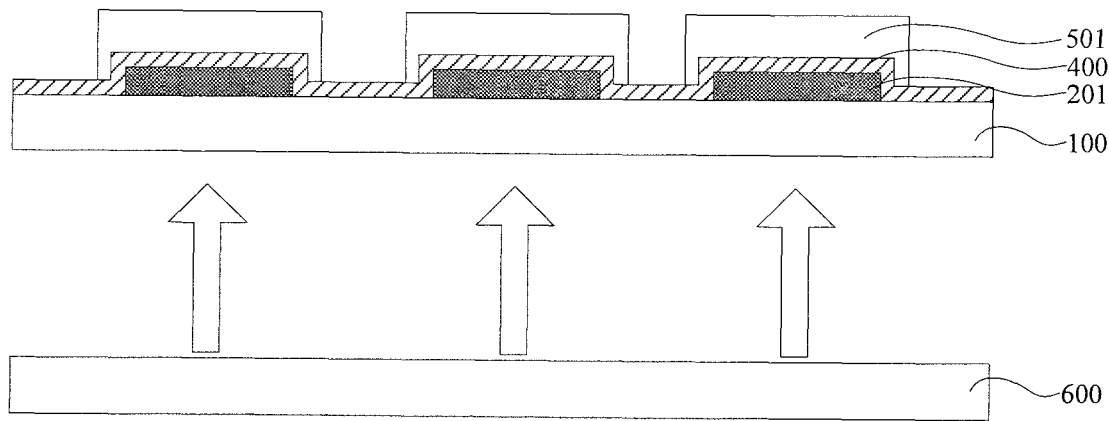

In step S605, as a result of shielding by the pattern 201 of metal shielding layer, a portion of light emitted from an exposure machine 600 located at a side of the base substrate 100 facing away from the pattern 201 of metal shielding layer is transmitted through the phase shift layer 400 with a light transmitting property, such that the first photoresist layer 500 is under-exposed to form the pattern 501 of first photoresist layer, as shown in FIG. 7e. An orthographic projection of the pattern 501 of first photoresist layer on the base substrate 100 completely covers an orthographic projection of the pattern 201 of metal shielding layer on the base substrate 100, and an area of the orthographic projection of the pattern 501 of first photoresist layer on the base substrate 100 is larger than an area of the orthographic projection of the pattern 201 of metal shielding layer on the base substrate 100.

Figure 7F:
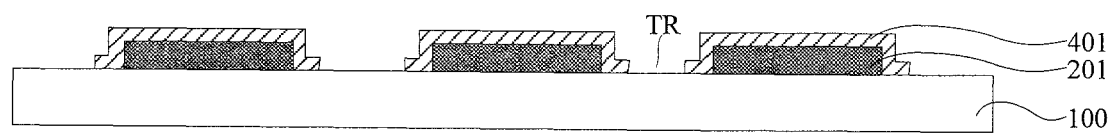

In step S606, the pattern of first photoresist layer 501 is used as a mask to etch the phase shift layer 400 so as to form a pattern 401 of phase shift layer, and then removing the pattern 501 of first photoresist layer, as shown in FIG. 7f.

Based on the same technical concept, an embodiment of the present disclosure further provides a phase shift mask. Since a principle of solving the problem of the phase shift mask is similar to that of the manufacturing method of the phase shift mask described above, the implementation of the phase shift mask may refer to the implementation of the manufacturing method, and details thereof are not repeated here.

Figure 8:
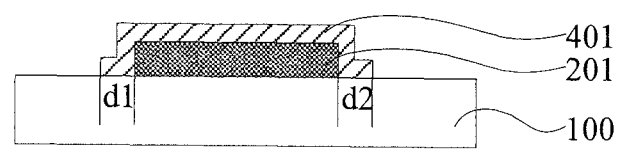
FIG. 8 is a schematic structural view of a phase shift mask according to an embodiment of the present disclosure.

Specifically, the phase shift mask provided by an embodiment of the present disclosure is manufactured by the above manufacturing method provided by the embodiments of the present disclosure. As shown in FIG. 8, the phase shift mask may include a base substrate 100, a pattern 201 of metal shielding layer on the base substrate 100, and a pattern 401 of phase shift layer covering the pattern 201 of metal shielding layer.

As shown, an orthographic projection of the pattern 401 of phase shift layer on the base substrate 100 completely covers an orthographic projection of the pattern 201 of metal shielding layer on the base substrate 100, and an area of the orthographic projection of the pattern 401 of phase shift layer on the base substrate 100 is larger than an area of the orthographic projection of the pattern 201 of metal shielding layer on the base substrate 100. In this way, the pattern 401 of phase shift layer may be formed in light-transmitting regions TR (as shown in FIG. 7O of the phase shift mask. By designing optical parameters of the pattern 401 of phase shift layer and the like, a phase difference of 180° (or odd-numbered multiples of 180°) may be introduced, so that a "phase shift" may be achieved.

As shown, the pattern 401 of phase shift layer may be strictly aligned with the pattern 201 of metal shielding layer without any offset.

Optionally, in the above phase shift mask provided by the embodiment of the present disclosure, as shown in FIG. 8, widths d1 and d2 of the orthographic projection of the pattern 401 of phase shift layer on the base substrate 100 extending beyond the pattern 201 of metal shielding layer on both opposite sides of the pattern 201 of metal shielding layer are identical to each other, that is, portions of the pattern 401 of phase shift layer extending beyond the pattern 201 of metal shielding layer on both opposite sides of the pattern 201 of metal shielding layer are symmetrical with each other.

Optionally, in the phase shift mask provided by the embodiment of the present disclosure, both the widths d1 and d2 of the orthographic projection of the pattern 401 of phase shift layer on the base substrate 100 extending beyond the pattern 201 of metal shielding layer on both opposite sides of the pattern 201 of metal shielding layer are substantially in a range from 0.3 µm to 1 µm. In this way, a good coherent light cancellation effect may be achieved.

Optionally, in the above phase shift mask provided by the embodiment of the present disclosure, the material of the pattern 201 of metal shielding layer generally include chromium, and the material of the pattern 401 of phase shift layer may be selected from chromium (Cr) oxide or molybdenum (Mo) oxide. Of course, other materials may also be used, and are not limited herein.

In the manufacturing method of the phase shift mask and the phase shift mask provided by the embodiments of the present disclosure, after forming the pattern of metal shielding layer on the base substrate, the phase shift layer and the first photoresist layer are sequentially formed on the pattern of metal shielding layer, then the first photoresist layer is patterned with the pattern of metal shielding layer serving as the mask to form the pattern of first photoresist layer; and finally the pattern of first photoresist layer is used as the mask to etch the phase shift layer so as to form the pattern of phase shift layer. The first photoresist layer is patterned with the pattern of metal shielding layer serving as the mask, instead of patterning the first photoresist layer by using the drawing machine in the related art, so that a self-alignment between the pattern of first photoresist layer and the pattern of metal shielding layer is achieved. In this way, the alignment offset which occurs in the exposures by using the drawing machine may be avoided. Thus, the pattern of phase shift layer and the pattern of metal shielding layer may be strictly aligned without any offset.

It will be apparent to those skilled in the art that various changes and modifications can be made to the embodiments of the present disclosure without departing from the spirit and scope of the disclosure. Thus, these changes and modifications are also considered to be included in the scope of the disclosure if they fall within the scope of the appended claims and equivalents thereof.

What is claimed is:

1. A manufacturing method of a phase shift mask, comprising:
    forming a pattern of metal shielding layer on a base substrate;
    forming a phase shift layer and a first photoresist layer in sequence on the pattern of metal shielding layer;
    patterning the first photoresist layer with the pattern of metal shielding layer serving as a mask to form a pattern of first photoresist layer in such a way that an orthographic projection of the pattern of first photoresist layer on the base substrate completely covers an orthographic projection of the pattern of metal shielding layer on the base substrate and an area of the orthographic projection of the pattern of first photoresist layer on the base substrate is larger than an area of the orthographic projection of the pattern of metal shielding layer on the base substrate; and
    etching the phase shift layer with the pattern of first photoresist layer serving as a mask to form a pattern of phase shift layer,
    wherein patterning the first photoresist layer with the pattern of metal shielding layer serving as the mask to form the pattern of first photoresist layer comprises:
    enabling at least a portion of light emitted from an exposure machine located at a side of the base substrate facing away from the pattern of metal shielding layer to be transmitted through the phase shift layer having a light transmitting property, with shielding by the pattern of metal shielding layer, such that the first photoresist layer is exposed to form the pattern of first photoresist layer.

2. The manufacturing method of claim 1, wherein exposing the first photoresist layer comprises:

under-exposing the first photoresist layer such that an orthographic projection of the pattern of first photoresist layer on the base substrate completely covers an orthographic projection of the pattern of metal shielding layer on the base substrate and an area of the orthographic projection of the pattern of first photoresist layer on the base substrate is larger than an area of the orthographic projection of the pattern of metal shielding layer on the base substrate.

3. The manufacturing method of claim 2, wherein etching the phase shift layer with the pattern of first photoresist layer serving as the mask to form the pattern of phase shift layer comprises:

etching the phase shift layer with the pattern of first photoresist layer serving as the mask to form the pattern of phase shift layer in such a way that an orthographic projection of the pattern of phase shift layer on the base substrate completely covers the orthographic projection of the pattern of metal shielding layer on the base substrate and an area of the orthographic projection of the pattern of phase shift layer on the base substrate is larger than the area of the orthographic projection of the pattern of metal shielding layer on the base substrate.

4. The manufacturing method of claim 1, wherein forming the pattern of metal shielding layer on the base substrate comprises:

forming a metal shielding layer and a second photoresist layer in sequence on the base substrate;
patterning the second photoresist layer to form a pattern of second photoresist layer;
etching the metal shielding layer with the pattern of second photoresist layer serving as a mask to form the pattern of metal shielding layer; and
removing the pattern of second photoresist layer.

5. The manufacturing method of claim 4, wherein patterning the second photoresist layer to form the pattern of second photoresist layer comprises:

drawing and patterning the second photoresist layer by using a drawing machine to form the pattern of second photoresist layer.

6. The manufacturing method of claim 1, further comprising: after forming the pattern of phase shift layer, removing the pattern of first photoresist layer.

* * * * *